(12) United States Patent
Dalzell et al.

(10) Patent No.: US 7,189,335 B1
(45) Date of Patent: Mar. 13, 2007

(54) CONFORMAL COVERINGS FOR ELECTRONIC DEVICES

(75) Inventors: William J. Dalzell, Parrish, FL (US); Kenneth H. Heffner, Largo, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/280,033

(22) Filed: Nov. 16, 2005

Related U.S. Application Data

(60) Provisional application No. 60/712,768, filed on Aug. 31, 2005.

(51) Int. Cl.
*B44C 1/22* (2006.01)
*C03C 15/00* (2006.01)
*C03C 25/68* (2006.01)

(52) U.S. Cl. ........................................... 216/36

(58) Field of Classification Search ............... 216/20, 216/16, 36; 427/96.2; 264/81
See application file for complete search history.

(56) References Cited

U.S. PATENT DOCUMENTS

| | | | |
|---|---|---|---|
| 4,947,235 | A | 8/1990 | Roth et al. |
| 5,718,863 | A | 2/1998 | McHugh et al. |
| 5,762,711 | A | 6/1998 | Heffner et al. |
| 5,783,259 | A | 7/1998 | McDonald |
| 5,877,093 | A | 3/1999 | Heffner et al. |
| 6,013,318 | A | 1/2000 | Hunt et al. |
| 6,110,537 | A | 8/2000 | Heffner et al. |
| 6,180,045 | B1 | 1/2001 | Brandenburg et al. |
| 6,285,551 | B1 | 9/2001 | Brandenburg et al. |
| 6,287,985 | B1 | 9/2001 | Hennfer et al. |
| 6,319,740 | B1 | 11/2001 | Heffner et al. |
| 6,549,426 | B1 | 4/2003 | Lawlyes et al. |
| 6,807,731 | B2 | 10/2004 | Brandenburg et al. |
| 2002/0117315 | A1 | 8/2002 | Gabower |

*Primary Examiner*—Parviz Hassanzadeh
*Assistant Examiner*—Roberts Culbert
(74) *Attorney, Agent, or Firm*—Fogg & Powers LLC

(57) ABSTRACT

Stand-alone conformal coverings for electronic devices and methods of making and using such coverings.

13 Claims, 3 Drawing Sheets

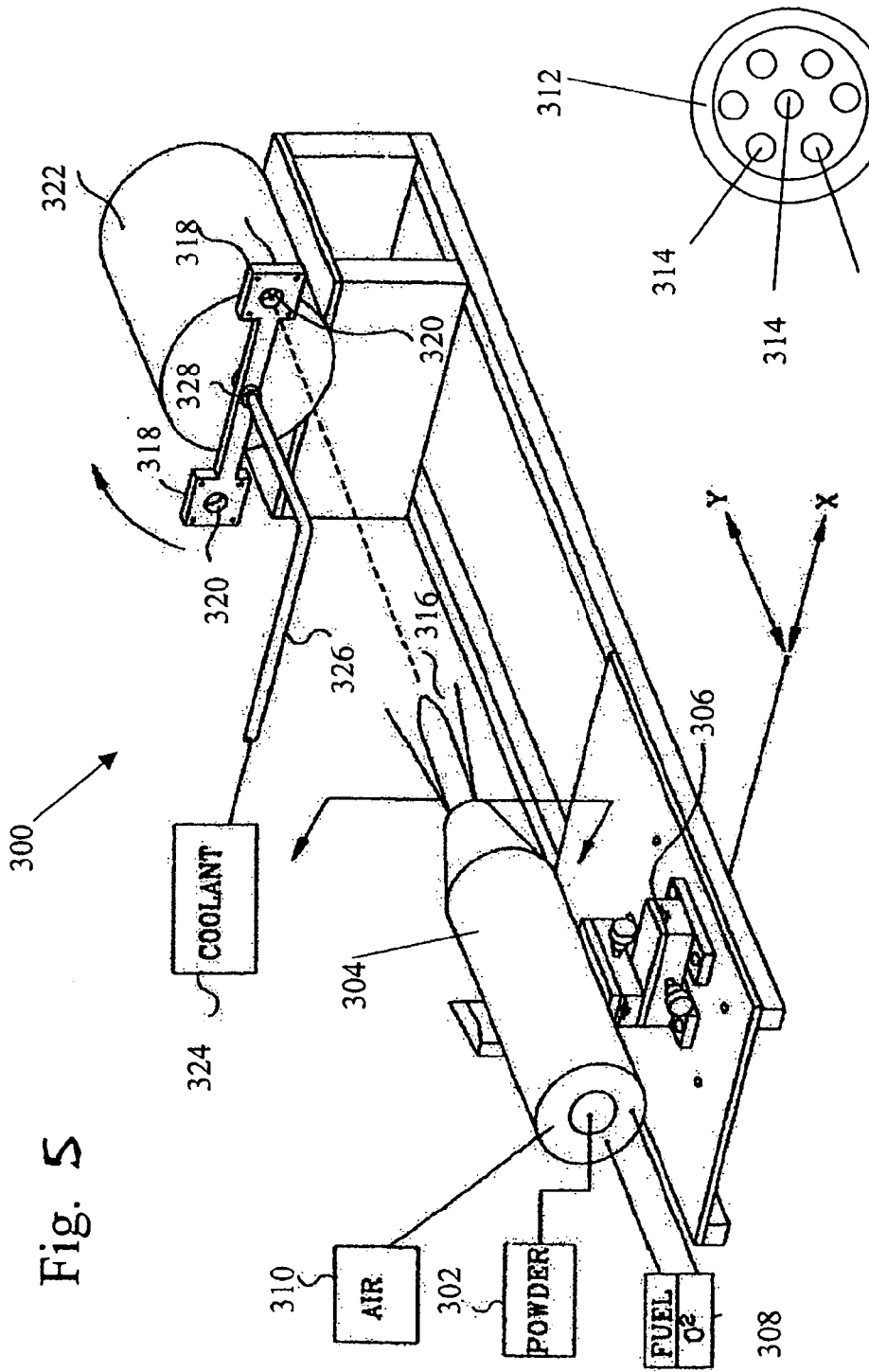
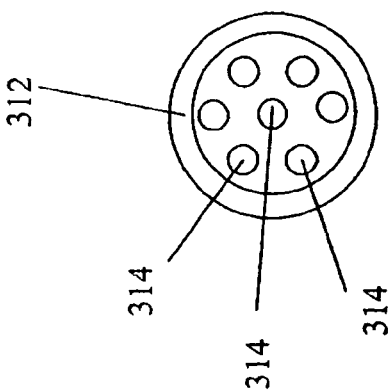
Fig. 5
Fig. 6

CONFORMAL COVERINGS FOR ELECTRONIC DEVICES

This application claims the benefit of U.S. Provisional Patent Application Ser. No. 60/712,768, filed on Aug. 31, 2005, entitled "Conformal Coverings for Electronic Devices," the entire disclosure of which is incorporated herein by reference for all purposes.

TECHNICAL FIELD

The present invention relates to conformal coverings for use with electronic devices. Such coverings can be used, for example, to protect electronic devices from the environment, block or help shield energy or radiation emitted from or received by electronic devices, and to help protect electronic devices from security breaches such as tampering and reverse engineering.

BACKGROUND

Specialized coatings are often used with electronic devices, especially microelectronic devices. Such coatings are used to provide shielding or blocking functions with respect to potentially harmful energy or electromagnetic radiation, for example. Such shielding can be used to protect a device from external energy sources and/or help contain energy emitted by an internal source. Thus, these coatings are often referred to as radio-opaque. Coatings can also be used to protect against tampering or reverse engineering. In this regard, these coatings are usually designed to cover all or some portion of an electronic device. Moreover, these coatings are usually designed to conform to weight and size restrictions and to minimize the number and complexity of steps to form the coating.

Various techniques can be used to provide coatings on electronic devices, one of which is known as thermal spraying. Examples of thermal spraying or coating processes include arc spraying, flame spraying, and plasma spraying. Thermal spraying generally refers to any process where metallic and/or non-metallic materials are deposited, in a molten or semi-molten condition, on a surface to form a coating of the material with a desired thickness. In this process, a thermal spraying nozzle provides a heated zone. The material to be deposited, in a powder or finely divided form, is passed through the heated zone of the spray nozzle under the force of a flowing gas or the like. As the materials are heated, they change to a plastic or molten state and are accelerated by the flowing gas. The particles are then directed to the surface to be coated. The particles strike the surface where they flatten and form thin platelets that conform and adhere to the irregularities of the surface and to each other. As the sprayed particles impinge upon the surface they coalesce, cool, build-up, and form a coating. Exemplary thermal spraying systems and processes for coating electronic devices are described in U.S. Pat. Nos. 5,762,711; 5,877,093; 6,110,537; 6,287,985; and 6,319,740 to Heffner et al., the entire disclosures of which are incorporated by reference herein for all purposes.

Well-known thermal spraying processes can be used to provide high quality functional coatings on surfaces of electronic devices without damaging such devices. However, such thermal spraying processes have some shortcomings in some applications. Thermal spraying processes for certain electronic devices typically deposit such coatings at a deposition efficiency level less than about thirty percent. One reason for this is that many electronic devices are sensitive to heat and deposition efficiency decreases with deposition temperature. Thus, the deposition temperature for a thermal spraying process cannot be so high as to damage the electronic device being coated and deposition efficiency suffers from lower deposition temperatures. Moreover, the density of the coating is also related to deposition temperature. Specifically, coating density decreases with decreasing temperature. Yet, many coatings for electronic devices, such as those that are desired to be radio-opaque, would have improved shielding properties with higher density but practical restrictions on deposition temperature limit the density by which shield coatings can be formed on devices using thermal spraying.

SUMMARY

The present invention provides conformal coverings, methods of forming such coverings, and methods of using such coverings with electronic devices. A covering in accordance with the present invention comprises a preformed structure, such as a stand-alone shell, for example, that can be bonded, adhered, or otherwise attached to an electronic device. In one aspect of the present invention, such a covering can be made by thermally spraying a conformal coating on a template that substantially represents the shape of the electronic device to be covered. The template preferably comprises a copy or replica of the electronic device or may be a sacrificial electronic device. The coating can be separated from the template to form a distinct stand-alone covering for the electronic device. The separated covering can then be attached, mechanically or adhesively, for example, to the electronic device.

Coating a template representative of the shape of an electronic device, rather than the actual device itself, provides many advantages. First, potential damage to sensitive electronic devices can be avoided because the device itself is not exposed or subject to the coating process. In this respect, coatings can be formed at higher temperatures and deposition efficiency can be increased. This also can provide coatings with improved properties such as increased density as compared to those formed at lower temperatures. Generally, denser materials are better at blocking harmful energy or electromagnetic radiation, for example.

In one aspect of the present invention a method of making a conformal covering for an electronic device is provided. The method comprises the steps of providing a template representative of the shape of at least a portion of an electronic device, forming a radio-opaque coating on at least a portion of a surface of the template, and separating at least a portion of the coating from the template.

In another aspect of the present invention, a method of providing a protective covering on an electronic device is provided. The method comprises the steps of providing a template representative of the shape of at least a portion of an electronic device, forming a radio-opaque coating on at least a portion of a surface of the template, separating at least a portion of the coating from the template, and attaching the separated portion of the coating to an electronic device.

In another aspect of the present invention, an electronic assembly comprising an electronic device and a conformal covering attached to at least a portion of the electronic device is provided. The conformal covering comprises a shell having a shape that substantially corresponds with the shape of the electronic device wherein the covering is capable of blocking reception and emission of electromagnetic radiation from a predetermined portion of the electromagnetic spectrum.

In yet another aspect of the present invention, a method of making a conformal covering for an electronic device is provided. The method comprising the steps of, thermally spraying a radio-opaque composition onto a template to form a radio-opaque coating on the template wherein the template has a topography substantially corresponding with an electronic device, separating at least a portion of the coating from the template to form a covering for the electronic device, and attaching the covering to the electronic device.

BRIEF DESCRIPTION OF THE DRAWINGS

These and other features, aspects, and advantages of the present invention will become better understood with regard to the following description, appended claims, and accompanying drawings where:

FIG. 5 shows an illustrative apparatus for creating coverings in accordance with the present invention using thermal spray techniques;

FIG. 6 is a front view of the thermal spray gun used in FIG. 5 showing the nozzle configuration.

DETAILED DESCRIPTION

Figure 1:
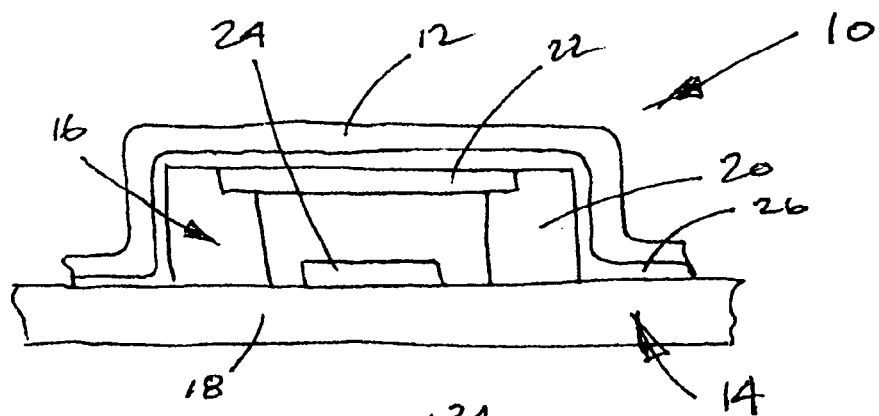
FIG. 1 is a schematic cross-sectional view of an electronic assembly comprising an electronic device and a covering in accordance with the present invention.

Referring to FIG. 1, electronic assembly 10 of the present invention is schematically illustrated in cross-section and comprises covering 12 positioned on electronic device 14. Electronic device 14 comprises packaged device 16 on substrate 18. Packaged device 16, as shown, comprises body 20, lid 22, and electronic circuitry 24 enclosed therein. Electronic device 14 may be in the form of electronic devices such as microelectronic devices, semiconductor chips, micro-electro-mechanical-systems, medical devices, and the like. Preferably, as illustrated, covering 12 is attached with adhesive layer 26. Exemplary adhesives that can be used include epoxy, polyurethane, polyamide, polyester, inorganic cement, combinations of these, and the like. Covering 12 may also be attached by using mechanical fasteners or welding such as laser or ultrasonic welding, for example.

Figure 2:
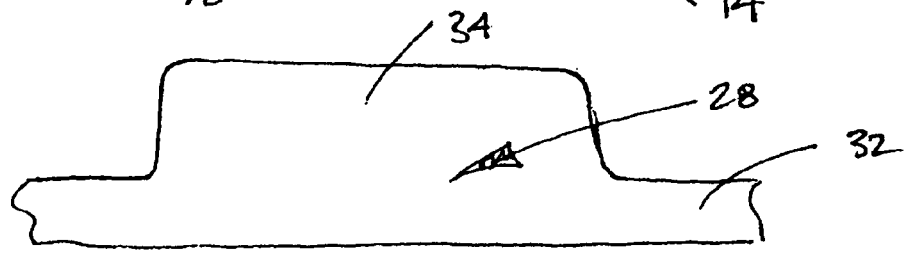
FIG. 2 is a schematic cross-sectional view of a template that is substantially representative of the outside shape of the electronic device of FIG. 1.
Figure 3:
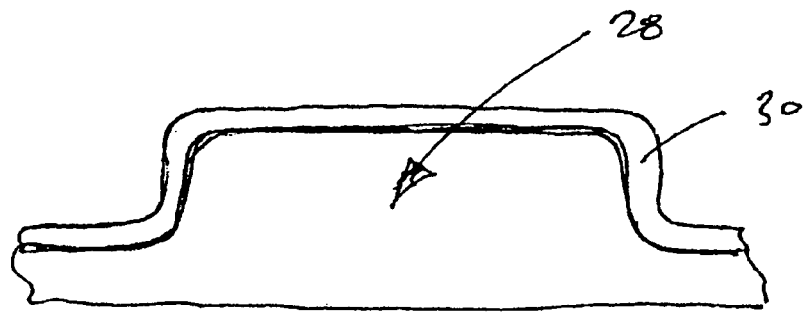
FIG. 3 is a schematic cross-sectional view of the template of FIG. 2 having a coating formed on the template in accordance with the present invention.
Figure 4:
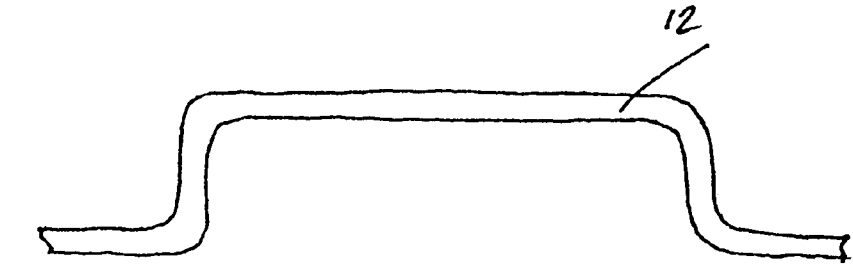
FIG. 4 is a schematic cross-sectional view of a covering in accordance with the present invention formed by separating the coating from the template of FIG. 3.

Referring to FIG. 2, a template 28 that can be used to form covering 12 in accordance with the present invention is schematically shown in cross-section. Template 28 is preferably designed so that covering 12 can be formed on template 28 such as by a thermal spray process as described in detail below. After covering 12 is formed on template 28, covering 12 is separated from the template 28 to form stand-alone covering 12, as shown in FIG. 4. Covering 12 can then be incorporated with the electronic device 14 as shown in FIG. 1 in accordance with the present invention.

As illustrated, template 28 is designed to substantially represent the shape of the electronic device 14 and is preferably a copy or replica of at least a portion of electronic device 14. In one aspect of the present invention, a mold can be made from the electronic device 14, which mold can be used to form the template 28. In another aspect of the present invention, a sacrificial electronic device otherwise identical to device 14 can be used as template 28.

As illustrated, template 28 comprises a base portion 32 and a raised portion 34. The base portion 32 corresponds with the substrate 28 and the raised portion 34 corresponds with the packaged device 16. In this way, the template 28 provides a replica or copy of the electronic device 14 and can be used to form covering 12 as a near net shape covering.

Template 28 is preferably designed so that the template 28 can be separated from the covering 12. In those instances in which a sacrificial device constitutes template 28, certain areas or regions, such as voids or openings, of such a sacrificial electronic device are preferably filled in with a suitable material before forming a coating on the electronic device 14. This preparation of template 28 makes it easier to remove covering 12 after covering 12 is formed. In any event, any known or future developed molding, die making, prototype making, model making, or forming techniques can be used to form the template 28. In other representative modes of practice, template 28 can be made from a material that can be selectively etched away with respect to covering 12 or otherwise easily separated therefrom. One exemplary material that can be used for the template 28 comprises aluminum in as much as reagents can be used to selectively etch aluminum with respect to a typical covering material such as tungsten. Optionally, a release layer can be provided on the template 28 that can allow easier separation of covering 12 from template 28.

Any material(s) that are compatible with the particular deposition process used to form the covering 12 can be used to form the template 28. In particular, template 28 is preferably designed in light of the temperature range it may be exposed to in a particular deposition process. Other considerations that may be used in selecting a material(s) for template 28 include cost, formability, and thermal expansion compatibility with a coating formed thereon.

Template 28 may comprise a single replica of electronic device 14, as illustrated, or may comprise plural replicas of electronic device 14 or any other electronic device(s). A template having plural replicas can be used for volume manufacturing and can take advantage of economies of scale with respect to a deposition process, for example. If a template having plural replicas of an electronic device is used, such template can be coated and the coating can be subsequently separated from the template as described below to form plural coverings in accordance with the present invention.

Covering 12 can be provided by any thin-film deposition technique. Masking techniques can be used during the deposition process to separate individual covering from each other or such coverings can be separated by saw or laser cutting after being separated from the template. Preferred deposition techniques include thermal spraying, chemical vapor deposition and combustion chemical vapor deposition. A preferred thermal spraying process is described in detail below. Other thermal spraying processes that can be used are described in U.S. Pat. Nos. 5,762,711; 5,877,093; 6,110,537; 6,287,985; and 6,319,740, the disclosures of which are fully incorporated herein for all purposes. Chemical vapor deposition is well known in the semiconductor processing arts and an example of a combustion chemical vapor deposition process can be found in U.S. Pat. No. 6,013,318 to Hunt et al., the disclosure of which is incorporated herein by reference for all purposes.

Covering 12 may comprise any material capable of being coated on template 28 and subsequently separated from template 28 to form covering 12 in accordance with the present invention. Covering 12 may comprise a single layer of material, plural layers of the same material, or plural layers of different materials.

Covering 12 may be formed from any material or combination of materials that help provide such a coating with radiation shielding characteristics. Radiation shielding relates to the use of a material(s) that can alter some characteristic of a source of particles and/or photons (such as spectrum, fluence, intensity, or the like) through physical interaction between the atomic structure of the atoms of the material and the incident photons or particles striking the material. The net reduction in such a characteristic of the incident particles or photons and any contribution by secondary radiation can be used to assess the shielding effectiveness of the material. For applications related to shielding harmful energy and/or electromagnetic radiation, preferred materials include refractory metals such as tungsten, molybdenum, niobium, and tantalum, for example. Representative examples of materials with radiation shielding characteristics include elements having an atomic number of 39 or greater, preferably 56 or greater, more preferably 72 or greater, compounds of such elements, alloys incorporating such elements, admixtures incorporating such elements, combinations of these and the like. Elements with low atomic numbers (hydrogen and carbon, for example) also have the capacity to shield radiation effectively. However, it typically takes more material to provide effective shielding. Representative examples of preferred elements include Hf, Ta, W, Re, Os, Ir, Pt, Au, Tl, Pb, Bi, and Ba. Heavier elements and materials incorporating such heavier elements, such as W, are more preferred singly or in combination, as these tend to provide more shielding capability at a given coating thickness than lighter elements. Carbon-based materials such as polyethylene may also be used. Polyethylene, for instance, is a suitable shielding material inasmuch as polyethylene coatings are highly dense due to favorable packing density characteristics.

For applications related to security, materials may be polymeric or otherwise organic, inorganic, metals, metal alloys, intermetallic compositions, semiconductor materials, combinations of these and the like. One or more piezoelectric materials are preferred for such security applications. Materials that can be used for security applications are described in Applicant's copending U.S. provisional patent application entitled "Security Techniques for Electronic Devices," filed on 15 Jul. 2005 in the name of William J. Dalzell, and having Ser. No. 60/699,688, the entire disclosure of which is incorporated by reference herein for all purposes.

The thickness of covering 12 can vary over a wide range depending on the desired functionality for the covering 12. When used for applications related to shielding electromagnetic radiation, for example, thickness of covering 12 is preferably sufficient to block such radiation as desired for the particular application. Generally, covering 12 can have a thickness suitable to the radiation spectrum, fluence and intensity of the operational environment. Proton and particle radiation spectra can be attenuated and shifted as a function of the coating material, coating thickness, and coating density. In one example tungsten metal can be applied to a thickness of 1 mil to 100 mils, more preferably 10 mils to 50 mils, even more preferably 20 mils to 30 mils. Such a coating preferably has a density of about 14 to 18 grams per cubic centimeter. In one preferred aspect of the present invention, thickness of covering 12 would be suitable for substantially shielding most spacecraft electronics from total dose in medium earth orbit natural space radiation environment.

Where covering 12 is desired to provide security functions, factors that can be used to determine thickness of covering 12 are described in Applicant's copending U.S. provisional patent application entitled "Security Techniques for Electronic Devices," filed on 15 Jul. 2005 in the name of William J. Dalzell, and having Ser. No. 60/699,688, the entire disclosure of which is incorporated by reference herein for all purposes. In any event, the thickness of covering 12 is preferably uniform but may vary based on factors such as design, the nature of the item(s) on which the coating is formed, the deposition process used, and/or the like.

In accordance with the present invention, covering 12 as formed on template 28, can have increased density as compared to directly coating electronic device 14 with a coating. This is because higher density can be achieved at higher temperatures. By using a template as an intermediary in accordance with the present invention instead of coating directly onto a device, it is possible to use higher coating temperatures without the risk of thermal damage to the device. This in turn enhances the density of the resultant covering 12. For example, the theoretical density of tungsten is about 19 grams per cubic centimeter. Coverings formed by directly coating an electronic device with tungsten have a density of about 14–15 grams per cubic centimeter. In accordance with the present invention, tungsten coverings with a density greater than 16 grams per cubic centimeter have been made.

In preferred modes of practice, coverings of the present invention advantageously are formed on templates using thermal spray techniques. Generally, thermal spraying involves causing a substrate to be coated to pass through a plume of a spray comprising molten particles of the coating composition. In preferred modes of practice, a line of sight coating process uses heat energy to heat the coating material to a molten state. The molten material typically is caused to be atomized or otherwise converted into molten droplets. The molten material is carried to the substrate by a carrier gas or jet. The molten droplets are preferably finely sized. During coating, the substrate is preferably moved in and out of the hot spray to minimize thermal risk to the substrate. The desired coating thickness desirably is built up using multiple passes. The substrate optionally may be thermally coupled to a heat sink and/or chilling media during thermal spraying in order to help carry away thermal energy imparted to the substrate.

One embodiment of a thermal spray system 300 useful to carry out thermal spraying is illustrated in FIGS. 5 and 6. Particles, e.g., a fine powder, of a coating composition are supplied from a composition feedstock supply 302 to thermal spray gun 304. The gun 304 is mounted on an X-Y positioning rack 306. Thermal spray gun 304 may be of a variety of types, including a flame gun, plasma gun, electric arc, gun or the like. For purposes of illustration, spray gun 304 is a flame-type gun. In such an embodiment, fuel and oxygen are supplied to the gun 304 from a fuel/oxidant supply 308 and air is supplied from an air supply 310. The air is ejected through annular nozzle 312, and a flame 316 is emitted from nozzles 314 located centrally inside annular nozzle 312. The air carries entrained particles (not shown), which are melted by the flame 316 as the particles exit the gun 304. The air acts not only as a carrier gas to help transport the molten particles to the substrate (not shown) to be coated, but the air also acts as a nozzle coolant.

The molten particles are aimed at a pair of rotatable arms 318. Arm ends 320 each receive one or more corresponding substrates to be coated. By rotating arms 318, the substrates repeatedly move in an out of the spray plume. In this way, the thermal spray coating can be applied without excessively heating the substrates if desired. Each substrate generally may be planar and may be fixedly mounted to an arm end 320. However, three dimensional substrates may also be coated. These would be mounted onto arms 318 so that the three dimensional substrate could be spun in several axis modes while the gun 304 sprays molten material onto the surfaces of the substrate in line of sight fashion.

The arms 318 are rotated by an electric motor 322. A coolant, such as compressed air, is pumped into the arms 318 from a coolant supply 324 through a pipe or hose 326 that connects to a coolant slip ring 328 located generally at the central axis of rotation of arms 318. The coolant flows from the slip ring to coolant passages (not shown) inside arms 318. Those passages desirably extend radially along the interior of arms 318 and each arm end 320.

The arms 318 rotate at a suitable rate, sweeping the mounted substrates through the spray of molten particles. As general guidelines, rotational rates within the range of 1 to 500 rpm, more desirably 300 to 350 rpm would be suitable. With each pass, the coating builds up on the surface(s) of the substrate in line of sight coating fashion. As a practical matter, the deposition of coating material tends to be a small swath along the substrate surfaces in the direction of rotation R, and as the arms 318 rotate. Accordingly, the gun 304 is indexed in the radial direction (X direction) with respect to the arms 318 so that the coating covers the entire surfaces to be coated. The speed of movement in the X direction optionally may be adjusted so that the deposition rate of material onto the substrate is constant. Otherwise, faster moving portions of the surfaces radially farther from the center of rotation may receive less material per unit time than those closer to the center of rotation.

The distance from the gun 304 to the arms 318 also is adjustable in the Y direction. A desired distance can be one at which substrate heating is below a desired threshold, yet the composition is still molten when it impacts the substrate. Thus, if gun 304 were to be too close to a substrate, the substrate might get too hot. If too far, the molten droplets might solidify too much before reaching the substrate surfaces, impairing the quality of the resultant coating.

Figure 7:
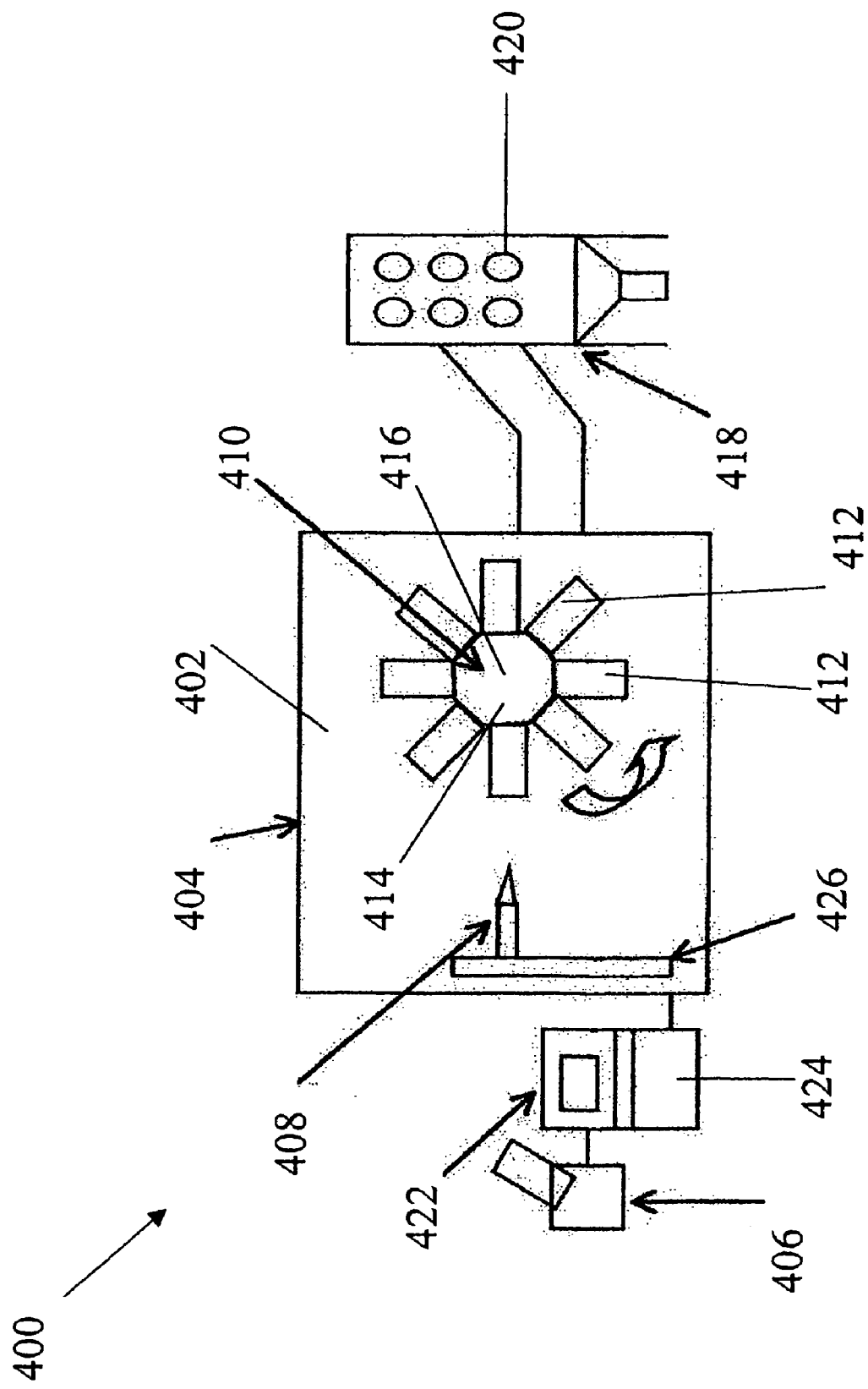
FIG. 7 is a schematic illustration of an alternative apparatus for creating coverings in accordance with the present invention using thermal spray techniques.

FIG. 7 schematically shows a thermal spray system 400 similar to system 300 of FIGS. 5 and 6, except system 400 of FIG. 7 is adapted for automated processing of larger batches of substrates (not shown) in a protected environment 402 defined by housing 404. Particles, e.g., a fine powder, of a coating composition are supplied from a composition feedstock supply 406 to the thermal spray gun 408. A carrier gas supply (not shown) and heat energy source (not shown) such as fuel, electricity, or the like, are also coupled to gun 408. As shown, gun 408 is a plasma gun, facilitating thermal spraying of materials such as tungsten, which become molten at very high temperatures, e.g., temperatures above about 3400 C. Supply 406 preferably includes an automated powder feeder that is outside environment 402 to facilitate convenient loading of powder feedstock. Gun 408 is generally aimed toward rotatable substrate mounting platform 410 including a plurality of arms 412 extending from centrally positioned rotor 414. Platform 410 rotates about central axis 416. System 400 also includes an exhaust system 418 includes a powder particulate collection system 420.

The movement of both gun 408 and rotatable substrate mounting platform 410 are automated and controlled via computer 422. An operator interfaces with the computer 422 and system 400 via console 424. Rotor 414 desirably has at least a computer-controlled rotation rate and rotation direction. Gun 408 is mounted on robotic manipulation system 426 which can control the distance between gun 408 and arms 412, the height of gun 408 relative to platform 410, the position of gun 408 relative to central axis 416, and the relative angle at which material is sprayed toward platform 410. The supply 406 of material to gun 408 is also automated and may be held constant or varied during the course of a coating operation as desired.

In a typical coating operation, the desired coating material is loaded into automated powder feeder of supply 406. One or more substrates (not shown) to be coated are positioned on one or more of arms 412. Desirably, the substrates are positioned in a balanced manner so that platform 410 rotates smoothly. Thus, pairs of substrates may be positioned in balanced fashion on opposed arms 412 symmetrically about central axis 416. If an odd number of substrates is being processed, a dummy substrate may also be used for balance. As is the case with arms 318 of apparatus 300 of FIGS. 5 and 6, arms 412 of system 400 can be designed to act as a heat sink to help draw thermal energy away from substrates being coated. Cooling media (not shown) may also be circulated through arms 412 to help cool the substrates if desired.

The powder is supplied to gun 408 and is sprayed from gun 408 toward rotating platform 410. During spraying, platform 410 rotates at a suitable rotational speed, such as a speed in the range of 100 to 500 rpm. Typically, gun 408 may be indexed radially back and forth relative to platform 410 to help ensure full coverage of surfaces to be coated. The speed at which gun 408 is indexed may be adjusted based upon the position of gun 408 relative to central axis 416 so that coating coverage is uniform notwithstanding the changing relative speed between arms 412 and gun 408 as the radial position of gun 408 with respect to central axis 416 changes. The heat source, in this case a plasma, provides enough heat energy to melt the sprayed particles. Typically, the heat source provides a suitable temperature in the range of 7000 C to about 20000 C. The carrier gas helps to transport the sprayed particles to the substrates. The carrier gas may be any gas such as nitrogen, carbon dioxide, argon, air, combinations of these, and the like. A preferred carrier gas comprises argon and optionally at least one other gas such as hydrogen, helium, nitrogen, carbon dioxide, or the like. A gas such as argon is favored because argon heats quickly in the flame of the gun 408.

A typical supply pressure for the carrier gas is in the range of 30 psi. The preferred primary (argon) and secondary gas (hydrogen) pressures are 75 psi and 50 psi respectively. The molten particles impact on the substrates, where they coalesce and form a coating. Areas of the substrates may be masked if those areas are desired to be uncoated after treatment. A suitable process time may be in the range of a few seconds to 600 seconds or more. A satisfactory coating thickness generally would be in the range of 5 micrometers to about 400 micrometers. Excess spray material is exhausted through exhaust system 418, where entrained particles in the exhaust are collected.

Methods and equipment used to carry out thermal spraying suitable in the practice of the present invention also have been described in U.S. Pat. Nos. 5,762,711; 5,877,093; 6,110,537; 6,287,985; and 6,319,740. Each of these patent documents is incorporated herein by reference.

After the covering 12 is separated from the template 28, processes such as cleaning, trimming, and/or post-machining or the like can be performed, as needed or desired. For example, the covering 12 may be polished to enhance gloss and surface finish as desired. In other modes of practice, the covering 12 may receive a protective overcoat (not shown) to protect the covering 12 from damage, oxidation, or the like. Examples of materials that would be suitable to form an overcoat include Al, W, Rh, reactive di-xylylene precursors applied by chemical vapor deposition, combinations of these, and the like.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

What is claimed is:

1. A method of making a conformal covering for an electronic device, the method comprising the steps of:
   providing a template representative of the shape of at least a portion of an electronic device;
   forming a radio-opaque coating on at least a portion of a surface of the template; and
   separating at least a portion of the coating from the template.

2. The method of claim 1, wherein the template comprises a replica of the electronic device.

3. The method of claim 2, comprising masking at least a portion of the electronic device.

4. The method of claim 1, wherein the step of forming a coating comprises a thermal spraying process.

5. The method of claim 1, wherein the step of separating at least a portion of the coating from the template comprises chemically dissolving at least a portion of the template.

6. A method of providing a protective covering on an electronic device, the method comprising the steps of:
   providing a template representative of the shape of at least a portion of an electronic device;
   forming a radio-opaque coating on at least a portion of a surface of the template;
   separating at least a portion of the coating from the template; and
   attaching the separated portion of the coating to an electronic device.

7. The method of claim 6, comprising attaching the separated portion of the coating to an electronic device with an epoxy.

8. The method of claim 6, comprising positioning the separated portion of the coating with respect to the electronic device so that the separated portion of the coating functions as an electromagnetic radiation shield.

9. The method of claim 6, comprising positioning the separated portion of the coating with respect to the electronic device so that the separated portion of the coating protects the electronic device from tampering or unauthorized access.

10. A method of making a conformal covering for an electronic device, the method comprising the steps of:
    thermally spraying a radio-opaque composition onto a template to form a radio-opaque coating on the template wherein the template has a topography substantially corresponding with an electronic device;
    separating at least a portion of the coating from the template to form a covering for the electronic device; and
    attaching the covering to the electronic device.

11. The method of claim 10, wherein the template comprises a replica of the electronic device.

12. The method of claim 10, wherein the step of separating at least a portion of the coating from the template comprises chemically dissolving at least a portion of the template.

13. The method of claim 10, further comprising providing a release layer on the template before thermally spraying the radio-opaque composition.

* * * * *